(12) United States Patent
Wu

(10) Patent No.: US 9,035,234 B2
(45) Date of Patent: May 19, 2015

(54) OPTICAL COMMUNICATION MODULE WITH LENS UNIT HAVING EXTENSION PORTIONS MOUNTED ON CIRCUIT BOARD

(71) Applicant: HON HAI PRECISION INDUSTRY CO., LTD., New Taipei (TW)

(72) Inventor: Kai-Wen Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 91 days.

(21) Appl. No.: 13/873,233

(22) Filed: Apr. 30, 2013

(65) Prior Publication Data

US 2014/0151536 A1    Jun. 5, 2014

(30) Foreign Application Priority Data

Nov. 30, 2012    (TW) .............................. 101144991 A

(51) Int. Cl.
*G01J 1/04* (2006.01)
*H01L 31/12* (2006.01)

(52) U.S. Cl.
CPC ...................................... *H01L 31/12* (2013.01)

(58) Field of Classification Search
CPC .......................................................... G02B 3/00
USPC ................ 250/214 R, 214.1, 239; 385/88–94
See application file for complete search history.

(56) References Cited

U.S. PATENT DOCUMENTS 7,198,413 B2 *    4/2007    Kao et al. ......................... 385/89
2014/0241673 A1 *    8/2014    Chan .............................. 385/92

* cited by examiner

*Primary Examiner* — Seung C Sohn
(74) *Attorney, Agent, or Firm* — Novak Druce Connolly Bove + Quigg LLP

(57) ABSTRACT

An optical communication module includes a lens unit and an optical-electrical converter. The optical-electrical converter includes a circuit board and the lens unit is fixed on the circuit board. The lens unit has an extension portion, and the extension portion extends outwards from the lens unit and is parallel to the circuit board. Glue is located between the extension portion and the circuit board to secure the lens unit on the circuit board.

10 Claims, 3 Drawing Sheets

OPTICAL COMMUNICATION MODULE WITH LENS UNIT HAVING EXTENSION PORTIONS MOUNTED ON CIRCUIT BOARD

BACKGROUND

1. Technical Field

The present disclosure relates to optical communication modules and, particularly, to an optical communication module having good binding force.

2. Description of Related Art

Optical communication modules comprise circuit boards, laser diodes, photo diodes, and lens units, for example. In package of the optical communication modules, the laser diodes and photo diodes are located on the circuit board first, and then glue is coated on the circuit board, and the lens unit is fixed on the glue to combine with the laser diodes and the photo diodes.

However, the glue is only coated between the bottom of the lens unit and the circuit board, so not only that the contact size between the lens unit and the circuit board is small but also that the binding force of the lens unit and the circuit board is small. When the circuit board fixed with the lens unit is connected with other structures, the lens unit may be detached from the circuit board.

Therefore, it is desirable to provide an optical communication module, which can overcome the limitations described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

Figure 1:
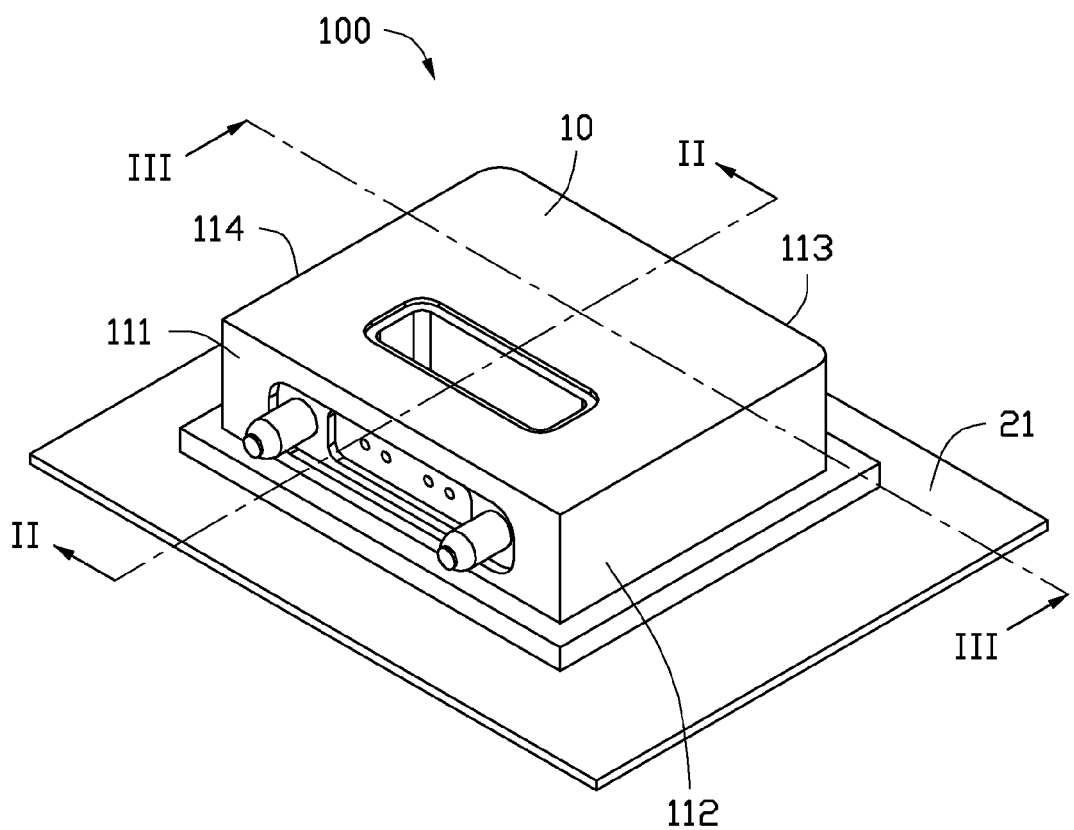
FIG. 1 is a schematic view of an optical communication module of an embodiment.
Figure 2:
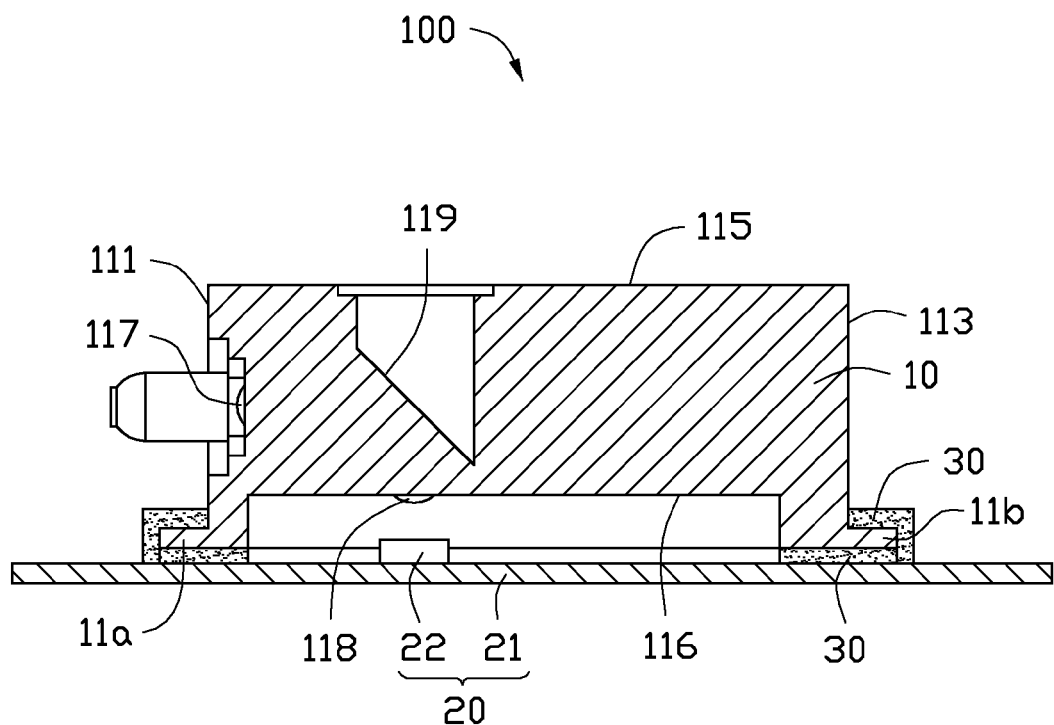
FIG. 2 is a cross-sectional view of the optical communication module, taken along the line II-II of FIG. 1.
Figure 3:
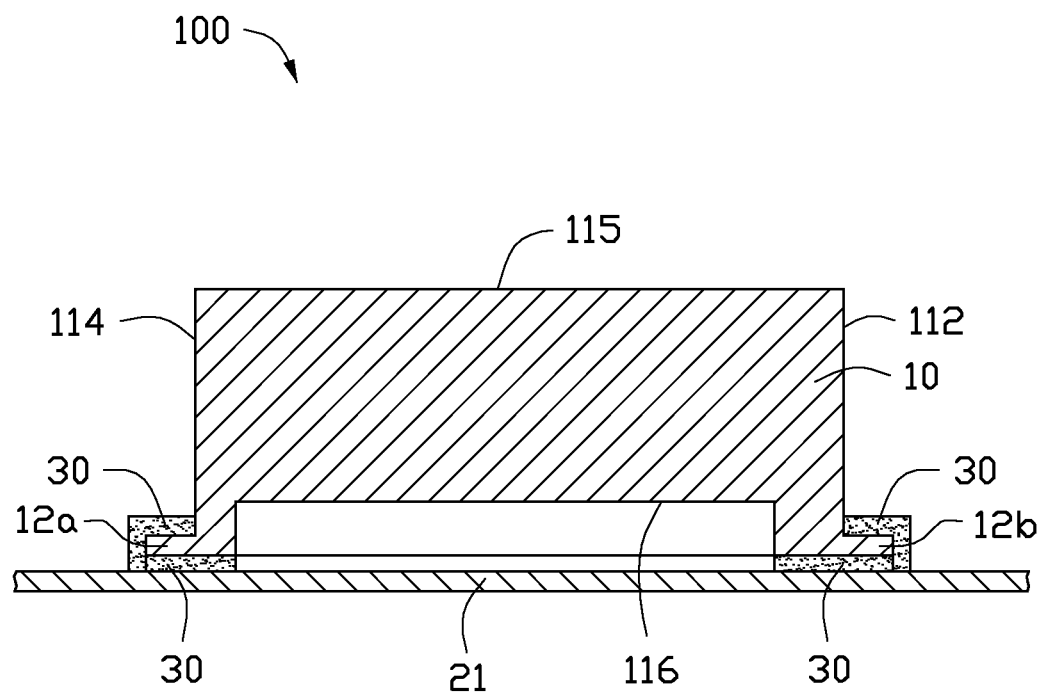
FIG. 3 is a cross-sectional view of the optical communication module, taken along the line of FIG. 1.

FIGS. 1 to 3 show an optical communication module 100 of an embodiment. The optical communication module 100 comprises a lens unit 10 and an optical-electrical converter 20.

The optical-electrical converter 20 comprises a circuit board 21 and optical-electrical components 22 for receiving and emitting light. The optical-electrical components 22 comprise light emitting diodes for emitting light, and photo diodes for receiving light. The circuit board 21 can be hard circuit boards or flexible circuit boards. When the circuit board 21 is a hard circuit board, the material of the circuit board 21 may be ceramic.

The lens unit 10 comprises a first surface 111, a second surface 112, a third surface 113, and a fourth surface 114 joined end to end in turn. The first surface 111 faces the third surface 113 and the second surface 112 faces the fourth surface 114. The lens unit 10 is fixed on the circuit board 21. The first surface 111, the second surface 112, the third surface 113, and the fourth surface 114 is perpendicularly fixed onto the circuit board 21 respectively.

The first surface 111 extends to form a first extension portion 11a and the third surface 113 extends to form a second extension portion 11b, the second surface 112 extends to form a third extension portion 12a, and the fourth surface 114 extends to form a fourth extension portion 12b. The first extension portion 11a, the second extension portion 11b, the third extension portion 12a, and the fourth extension portion 12b respectively are parallel with the circuit board 21.

In other embodiments, the lens unit 10 can only comprise the first extension portion 11a and the second extension portion 11b, or the lens unit 10 can only comprises the third extension portion 12a and the fourth extension portion 12b. In other words, the first surface 111 and the second surface 112 have extension portions or the third surface 113 and the fourth surface 114 have extension portions.

The lens unit 10 also comprises a fifth surface 115 and a sixth surface 116. The fifth surface 115 faces away from the circuit board 21. The sixth surface 116 faces toward the circuit board 21. A plurality of first lenses 117 are formed on the first surface 111. A plurality of second lenses 118 are formed on the sixth surface 116 respectively. The number of the first lenses 117 is identical to the number of the second lenses 118. The optical axes of the first lenses 117 are parallel with each other. The optical axes of the second lenses 118 are parallel with each other. A reflecting surface 119 is set between the fifth surface 115 and the sixth surface 116. The reflecting surface 119 is inclined to the fifth surface 115 and the sixth surface 116. The reflecting surface 119 is configured for reflecting the light passing through the first lenses 117 and the second lenses 118. Each of the first lenses 117 is coupled with an optical fiber. Light beams passing through the optical fiber irradiate on the reflecting surface 119 through the first lens 117. After being reflected by the reflecting surface 119, the light beams pass through the second lens 118. At last, the photo diodes of the optical-electrical components 22 located on the circuit board 21 receive the light beams respectively. The light beams emitted by the light emitting diodes of the optical-electrical components 22 pass through the second lenses 118 and the reflecting surface 119 in turn, and then are coupled into the optical fibers by the first lenses 117 respectively.

Both an included angle between the reflecting surface 119 and the optical axis of the first lens 117 and an included angle between the optical axis of the second lens 118 and the reflecting surface 119 are 45 degrees. An included angle between the circuit board 21 and the reflecting surface 119 is also 45 degrees.

In assembly, glue 30 is coated on the circuit board 21, and the lens unit 10 is mounted on the glue 30, with each of the first extension portion 11a, the second extension portion 11b, the third extension portion 12a, and the fourth extension portion 12b mounted on the circuit board 21 through the glue 30. The glue 30 is solidified, the lens unit 10 is fixed on the circuit board 21.

The first extension portion 11a, the second extension portion 11b, the third extension portion 12a, and the fourth extension portion 12b increase the contact area between the lens unit 10 and the circuit board 21. When the lens unit 10 is fixed on the circuit board 21, the glue 30 is coated not only between the bottom of the lens unit 10 and the circuit board 21, but also between each of the extension portions 11a, 11b, 12a, 12b and the circuit board 21. Thus, a binding force between the lens unit 10 and the circuit board 21 increases.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the disclosure.

What is claimed is:

1. An optical communication module, comprising:
an optical-electrical converter, comprising a circuit board;
a lens unit comprising at least one extension portion, the at least one extension portion extending outwards from the lens unit and being substantively parallel with the circuit board; and
glue coated on the at least one extension portion and the circuit board to secure the lens unit on the circuit board and bond the at least one extension portion and the circuit board together.

2. The optical communication module of claim 1, wherein the circuit board is selected from the group consisting of hard circuit board and flexible circuit board.

3. The optical communication module of claim 1, wherein the optical-electrical converter comprises light emitting diodes and photo diodes.

4. The optical communication module of claim 3, wherein the lens unit comprises lenses, and the lenses are arranged on a surface of the lens unit facing to the circuit board and are configured for coupling with the light emitting diodes and the photo diodes.

5. The optical communication module of claim 4, wherein the lens unit comprises a reflecting surface.

6. The optical communication module of claim 5, wherein an included angle between the reflecting surface and the circuit board is 45 degrees.

7. The optical communication module of claim 5, wherein an included angle between the reflecting surface and an optical axis of each of the lenses is 45 degrees.

8. The optical communication module of claim 1, wherein the lens unit comprises four first surfaces perpendicular to the circuit board, the at least one extension portion comprises four extension portions, and each of the four extension portions extends outwards from a respective one of the four first surfaces.

9. The optical communication module of claim 8, wherein the lens unit comprises two second surfaces, one of the two second surfaces faces away from the circuit board, another one of the two second surfaces faces toward the circuit board.

10. The optical communication module of claim 9, wherein the lens unit comprises a plurality of first lenses on one of the first surfaces and a plurality of second lenses on one of the second surfaces, the first lenses face toward the circuit board, and the number of the first lenses is identical to the number of the second lenses.

* * * * *